(12) United States Patent
Kolev et al.

(10) Patent No.: US 10,770,391 B2
(45) Date of Patent: Sep. 8, 2020

(54) TRANSISTOR WITH GATE EXTENSION TO LIMIT SECOND GATE EFFECT

(71) Applicant: QUALCOMM Incorporated, San Diego, CA (US)

(72) Inventors: Plamen Vassilev Kolev, San Diego, CA (US); Michael Andrew Stuber, Rancho Santa Fe, CA (US); Lee-Wen Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/936,907

(22) Filed: Mar. 27, 2018

(65) Prior Publication Data

US 2019/0304898 A1  Oct. 3, 2019

(51) Int. Cl.

| | |
|---|---|
| *H01L 23/522* | (2006.01) |
| *H01L 29/06* | (2006.01) |
| *H01L 29/78* | (2006.01) |
| *H01L 21/28* | (2006.01) |
| *H01L 29/423* | (2006.01) |
| *H01L 21/762* | (2006.01) |
| *H01L 23/66* | (2006.01) |
| *H01L 23/552* | (2006.01) |
| *H01L 23/64* | (2006.01) |
| *H01L 29/786* | (2006.01) |
| *H01L 27/12* | (2006.01) |

(52) U.S. Cl.
CPC .... *H01L 23/5225* (2013.01); *H01L 21/28123* (2013.01); *H01L 21/7624* (2013.01); *H01L 23/552* (2013.01); *H01L 23/642* (2013.01); *H01L 23/645* (2013.01); *H01L 23/66* (2013.01); *H01L 27/1266* (2013.01); *H01L 29/0649* (2013.01); *H01L 29/4238* (2013.01); *H01L 29/42384* (2013.01); *H01L 29/7838* (2013.01); *H01L 29/78603* (2013.01); *H01L 29/78654* (2013.01); *H01L 27/124* (2013.01)

(58) Field of Classification Search
None
See application file for complete search history.

(56) References Cited

U.S. PATENT DOCUMENTS

| | | | |
|---|---|---|---|
| 6,753,579 B2 * | 6/2004 | Baba | H01L 29/78615 257/365 |
| 7,576,382 B2 | 8/2009 | Ueno | |
| 8,013,361 B2 * | 9/2011 | Yamashita | H01L 21/76895 257/202 |
| 8,456,151 B2 | 6/2013 | Krauss et al. | |

(Continued)

*Primary Examiner* — Andres Munoz
(74) *Attorney, Agent, or Firm* — QUALCOMM Incorporated

(57) ABSTRACT

A transistor may include a semiconductor layer having a source region, a drain region, and a channel region between the source region and the drain region. The channel region may have a source interface and a drain interface, and may be bounded by edges extending from the source interface to the drain interface on two boundaries between a field-sensitive semiconductor material and an isolation material. The transistor may further include an insulator layer on the channel region. The transistor may further include a gate on the insulator layer. The gate may have extensions beyond edges of the channel region. The extensions may substantially exceed a minimum specified value.

16 Claims, 10 Drawing Sheets

(56) References Cited

U.S. PATENT DOCUMENTS

| | | | | |
|---|---|---|---|---|
| 9,112,014 B2* | 8/2015 | Vinet | ............... | H01L 21/743 |
| 9,478,507 B2* | 10/2016 | Stuber | ............... | H01L 23/60 |
| 9,825,124 B2 | 11/2017 | Korec et al. | | |
| 9,941,377 B2* | 4/2018 | Yang | ............... | H01L 21/28088 |
| 10,115,787 B1* | 10/2018 | Paul | ............... | H01L 29/42372 |
| 2005/0253175 A1* | 11/2005 | Taddiken | ............... | H01L 29/78624 |
| | | | | 257/288 |
| 2009/0014796 A1* | 1/2009 | Liaw | ............... | H01L 27/11 |
| | | | | 257/347 |
| 2009/0108349 A1* | 4/2009 | Kim | ............... | H01L 27/0207 |
| | | | | 257/347 |
| 2012/0231620 A1* | 9/2012 | Kuroda | ............... | H01L 21/74 |
| | | | | 438/586 |
| 2013/0049215 A1* | 2/2013 | Larsen | ............... | H01L 23/485 |
| | | | | 257/774 |
| 2017/0098704 A1 | 4/2017 | Koudymov | | |
| 2017/0162692 A1* | 6/2017 | Brindle | ............... | H01L 29/4908 |
| 2017/0207177 A1 | 7/2017 | Molin et al. | | |

* cited by examiner

TRANSISTOR WITH GATE EXTENSION TO LIMIT SECOND GATE EFFECT

BACKGROUND

Field

Aspects of the present disclosure relate to semiconductor devices and, more particularly, to transistors.

Background

Mobile radio frequency (RF) chips (e.g., mobile RF transceivers) have migrated to a deep sub-micron process node due to cost and power consumption considerations. Designing such mobile RF transceivers becomes complex at this deep sub-micron process node. Designing these mobile RF transceivers is further complicated by added circuit functions for supporting communication enhancements, such as 5G communications. Further design challenges for mobile RF transceivers include analog/RF performance considerations, including mismatch, noise, and other performance considerations. Designs of these mobile RF transceivers may include additional passive devices, for example, for biasing and suppressing resonance, and/or for performing filtering, bypassing, and coupling.

Conventional metal-oxide-semiconductor field-effect transistors (MOSFETs) with sources and drains having a same low body doping may be implemented as desirable small-area transistors used as high-value resistors. Unfortunately, these devices are prone to large conductance variations due to a variable bias supplied by a handle wafer placed above a polysilicon gate and interconnects. Specifically, the handle wafer may act as a second gate that produces an undesirable second-gate effect that interferes with proper functioning of the transistor. This is because the gate of the transistor does not completely shield the transistor body from electrical fields generated from the handle wafer. Therefore, there is a desire for small-sized, scalable transistors that overcome these deficiencies.

SUMMARY

A transistor may include a semiconductor layer having a source region, a drain region, and a channel region between the source region and the drain region. The channel region may have a source interface and a drain interface, and may be bounded by edges extending from the source interface to the drain interface on two boundaries between a field-sensitive semiconductor material and an isolation material. The transistor may further include an insulator layer on the channel region. The transistor may also include a gate on the insulator layer. The gate may have extensions beyond edges of the channel region. The extensions may substantially exceed a minimum specified value.

A method of fabricating a transistor may include fabricating a semiconductor layer comprising a source region, a drain region, and a channel region between the source region and the drain region. The method may further include depositing an insulator layer on the channel region. The method may also include fabricating a gate on the insulator layer. The gate may have extensions beyond edges of the channel region. The extensions may substantially exceed a minimum specified value.

A transistor may include a semiconductor layer having a source region, a drain region, and a channel region between the source region and the drain region. The channel region may have a source interface and a drain interface, and may be bounded by edges extending from the source interface to the drain interface on two boundaries between a field-sensitive semiconductor material and an isolation material. The transistor may further include an insulator layer on the channel region. The transistor may also include a shielding means on the insulator layer. The shielding means may include extensions beyond edges of the channel region. The extensions may substantially exceed a minimum specified value.

Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
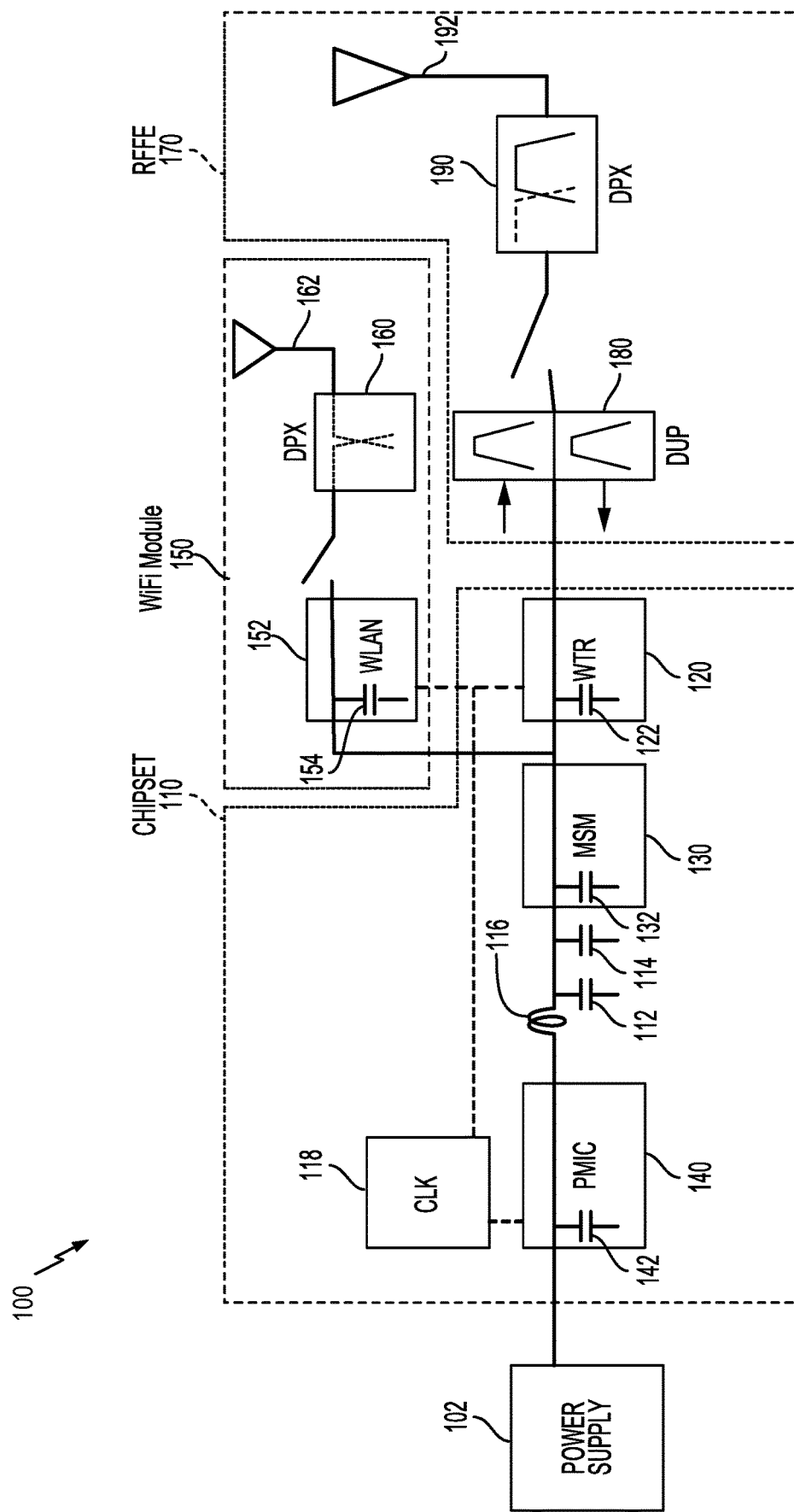
FIG. 1 is a schematic diagram of a radio frequency (RF) front end module.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as fifth generation (5G) wireless communications.

The design of these mobile RF transceivers may include the use of silicon on insulator technology. Silicon on insulator (SOI) technology replaces conventional silicon substrates with a layered silicon—insulator—silicon substrate to reduce parasitic device capacitance and improve performance. SOI-based devices differ from conventional, silicon-built devices because the silicon junction is above an electrical isolator, typically a buried oxide (BOX) layer.

Conventional complementary metal-oxide-semiconductor (CMOS) technology begins with a front-end-of-line (FEOL), in which a first set of process steps are performed for fabricating active devices (e.g., negative MOS (NMOS) or positive MOS (PROS) transistors) on a substrate (e.g., a silicon on insulator (SOI) substrate). A middle-of-line (MOL) is performed next, which is a set of process steps that connect the active devices to the back-end-of-line (BEOL) interconnects (e.g., M1, M2, M3, M4, . . . Mx) using middle-of-line contacts.

The front-end-of-line processes may include the set of process steps that form the active devices (e.g., transistors). The front-end-of-line processes include ion implantation, anneals, oxidation, chemical vapor deposition (CVD) or atomic layer deposition (ALD), etching, chemical mechanical polishing (CMP), and epitaxy. The middle-of-line processes may include the set of process steps that enable connection of the transistors to BEOL interconnects. These steps include silicidation and contact formation, as well as stress introduction. The back-end-of-line processes may include the set of process steps that form the interconnects that tie the independent transistors and form circuits. Currently, copper and aluminum are materials to form the interconnects, but with further development of the technology, other conductive materials may be used.

Conventional metal-oxide-semiconductor field-effect transistors (MOSFETs) with sources and drains having a same low body doping may be implemented as desirable small-area transistors used as high-value resistors. Unfortunately, these devices are prone to large conductance variations due to a variable bias supplied by a handle wafer placed above a polysilicon gate and interconnects. Specifically, the handle wafer may act as a second gate that produces an undesirable second-gate effect that interferes with proper functioning of the transistor. This is because the gate of the transistor does not completely shield the transistor body from electrical fields generated from the handle wafer. These electric fields may induce the large conductance variations in these MOSFET devices. Despite these shortcomings, chip designers still have a strong interest in scalable transistors with a small size, small parasitic capacitance and inductance, a large resistance, and a high linearity.

Additionally, the scalable transistors should be capable of being implemented in a layer transfer SOI CMOS process or other CMOS processes, including standard semiconductor on insulator (SOI) and bulk CMOS processes. Furthermore, this device may also be used in RF circuits where its low size is expected to provide very low parasitic capacitance and inductance, particularly in conjunction with a layer transfer SOI CMOS process. Therefore, there is a desire for small-sized, scalable transistors that overcome these deficiencies.

Aspects of the present disclosure provide for a transistor including a semiconductor layer. The semiconductor layer may include a source region, a drain region, and a channel region between the source region and the drain region. The channel region may have an opposite polarity to a polarity of the source region and the drain region. A shielding layer may be supported by the channel region and may extend beyond edges of the channel region.

According to aspects of the present disclosure, a front-side gate may prevent interference from conductive layers above the active portion of the device. For example, a bias interference from conductive layers above the transistor, including a handle wafer in a layer transfer SOI CMOS device, may be avoided by a sufficient extension of a gate or a conductive interconnect layer to sufficiently cover an active semiconductor (e.g., silicon) layer.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably.

FIG. 1 is a schematic diagram of a wireless device 100 (e.g., a cellular phone or a smartphone) having a transistor, according to aspects of the present disclosure. The wireless device 100 may include a wireless local area network (WLAN) (e.g., WiFi) module 150 and a RF front end module 170 for a chipset 110. The WiFi module 150 includes a first diplexer 160 communicably coupling an antenna 162 to a wireless local area network module (e.g., WLAN module 152). The RF front end module 170 includes a second diplexer 190 communicably coupling an antenna 192 to the wireless transceiver 120 (WTR) through a duplexer 180 (DUP).

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile RF transceiver to transmit and receive data for two-way communication. A mobile RF transceiver may include a transmit section for data transmission and a receive section for data reception. For data transmission, the transmit section may modulate a RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna 192 and may amplify the received RF signal using a low noise amplifier (LNA) and process the received RF signal to recover data sent by the base station in a communication signal.

The wireless transceiver 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the wireless transceiver 120.

The wireless transceiver 120 and the RF front end module 170 may be implemented using semiconductor on insulator (SOI) technology for fabricating transistors of the wireless transceiver 120 and the RF front end module 170, which reduces high order harmonics in the RF front end module 170. SOI technology replaces conventional semiconductor substrates with a layered semiconductor—insulator—semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on an SOI layer and an SOI substrate supporting the BOX layer. A layer transfer process to further separate the active device from an SOI substrate is shown in FIGS. 2A to 2D.

Figure 2A:
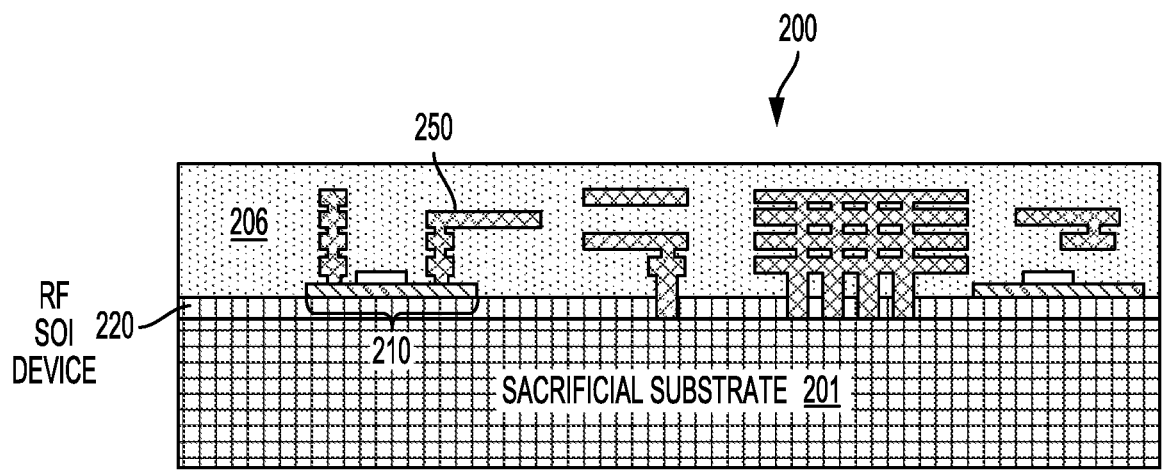
FIGS. 2A to 2D show cross-sectional views of an integrated radio frequency (RF) circuit structure during a layer transfer process.
Figure 2B:
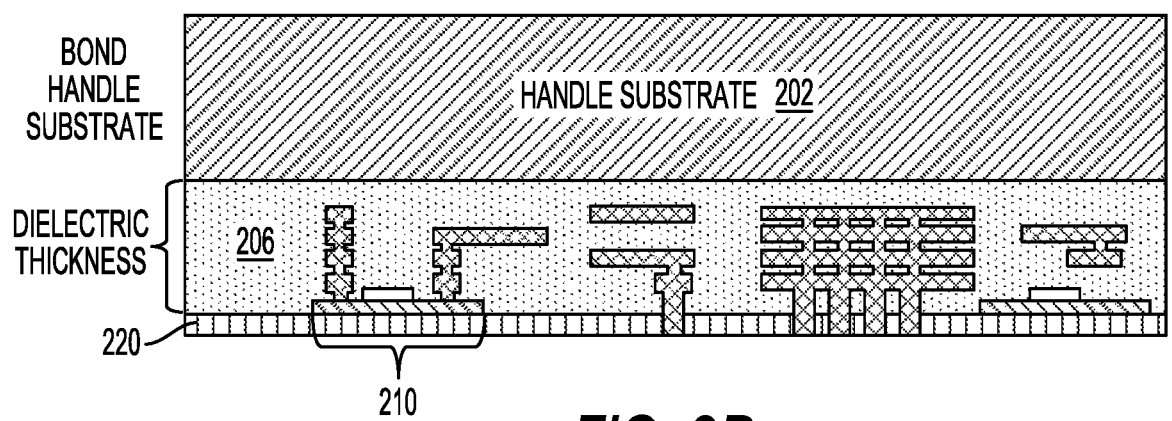

FIGS. 2A to 2D show cross-sectional views of an integrated radio frequency (RF) circuit structure 200 during a layer transfer process according to aspects of the present disclosure. As shown in FIG. 2A, an RF silicon on insulator (SOI) device includes an active device 210 on a buried oxide (BOX) layer 220 supported by a sacrificial substrate 201 (e.g., a bulk wafer). The RF SOI device also includes interconnects 250 coupled to the active device 210 within a front-side dielectric layer 206. As shown in FIG. 2B, a handle substrate 202 is bonded to the front-side dielectric layer 206 of the RF SOI device. In addition, the sacrificial substrate 201 is removed. Removal of the sacrificial substrate 201 using the layer transfer process enables high-performance, low-parasitic RF devices by increasing the dielectric thickness. That is, a parasitic capacitance of the RF SOI device is inversely proportional to the dielectric thickness, which determines the distance between the active device 210 and the handle substrate 202.

Figure 2C:
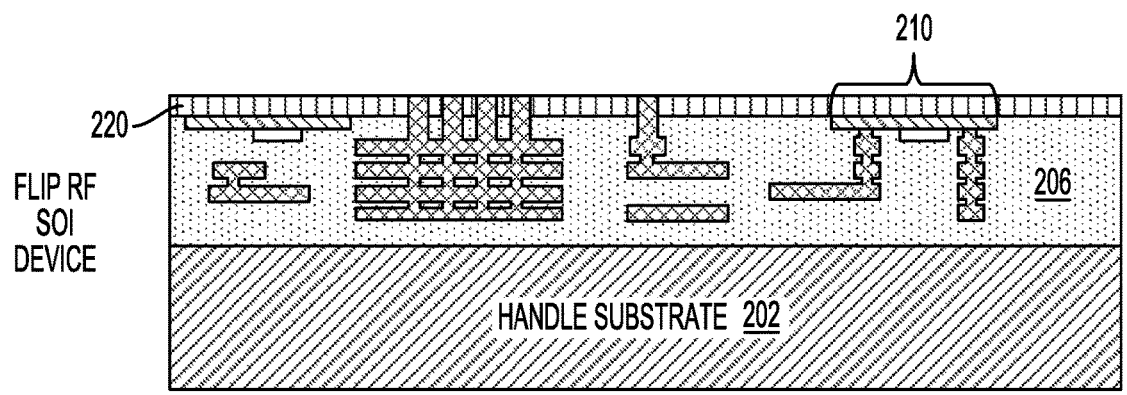
Figure 2D:
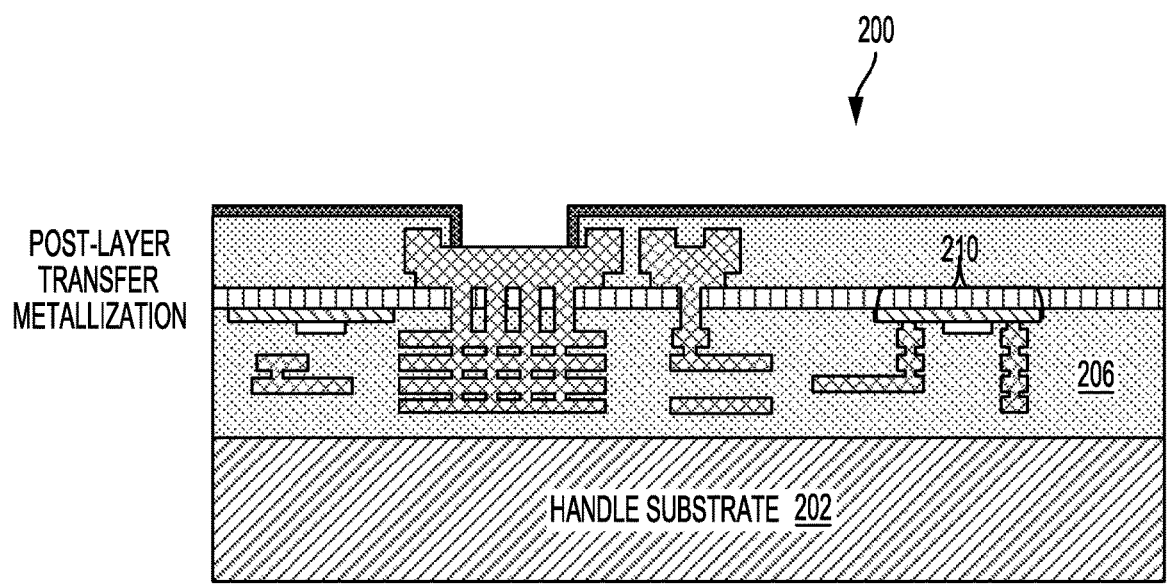

As shown in FIG. 2C, the RF SOI device is flipped once the handle substrate 202 is secured and the sacrificial substrate 201 are removed. As shown in FIG. 2D, a post layer transfer metallization process is performed using, for example, a regular complementary metal-oxide-semiconductor (CMOS) process. The integrated RF circuit structure 200 may be completed by depositing a passivation layer, opening bond pads, depositing a redistribution layer, and forming conductive bumps/pillars to enable bonding of the integrated RF circuit structure 200 to a system board (e.g., a printed circuit board (PCB)).

Referring again to FIG. 2A, the RF SOI device may include a trap rich layer between the sacrificial substrate 201 and the BOX layer 220. In addition, the sacrificial substrate 201 may be replaced with the handle substrate, and a thickness of the BOX layer 220 may be increased to improve harmonics. Although this arrangement of the RF SOI device may provide improved harmonics relative to a pure silicon or SOI implementation, the RF SOI device is limited by the non-linear responses from the handle substrate, especially when a silicon handle substrate is used. That is, in FIG. 2A, the increased thickness of the BOX layer 220 does not provide sufficient distance between the active device 210 and the sacrificial substrate 201 relative to the configurations shown in FIGS. 2B to 2D. Moreover, the RF SOI device is generally limited to CMOS transistor formation on one side of the SOI layer.

Figure 3:
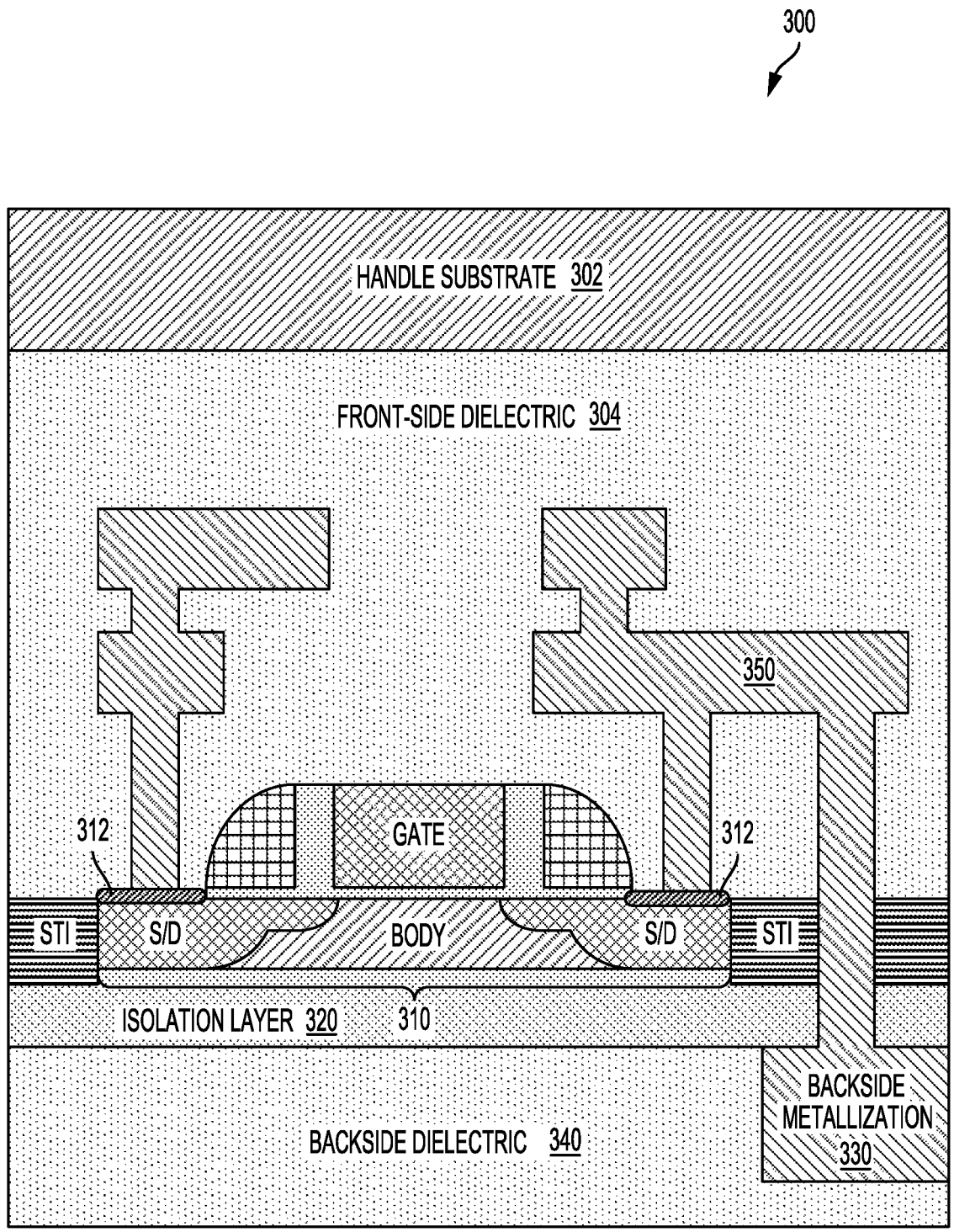
FIG. 3 is a cross-sectional view of an integrated radio frequency (RF) circuit structure fabricated using a layer transfer process.

FIG. 3 is a cross-sectional view of an integrated radio frequency (RF) circuit structure 300 fabricated using a layer transfer process according to aspects of the present disclosure. Representatively, the integrated RF circuit structure 300 includes an active device 310 having a gate, a body, and source/drain regions formed on an isolation layer 320. In silicon on insulator (SOI) implementations, the isolation layer 320 is a buried oxide (BOX) layer, and the body and source/drain regions are formed from an SOI layer including shallow trench isolation (STI) regions supported by the BOX layer.

The integrated RF circuit structure 300 also includes middle-of-line (MOL)/back-end-of-line (BEOL) interconnects coupled to the source/drain regions of the active device 310. As described, the MOL/BEOL layers are referred to as front-side layers. By contrast, the layers supporting the isolation layer 320 may be referred to as backside layers. According to this nomenclature, a front-side interconnect 350 is coupled to the source/drain regions of the active device 310 through front-side contacts 312 in a front-side dielectric layer 304. In addition, a handle substrate 302 is coupled to the front-side dielectric layer 304. In this configuration, a backside dielectric layer 340 is adjacent to and possibly supports the isolation layer 320. In addition, a backside metallization 330 is coupled to the front-side interconnect 350.

As shown in FIG. 3, a layer transfer process increases separation between the active device 310 and the handle substrate 302 to improve the harmonics of the integrated RF circuit structure 300. Various aspects of the present disclosure provide techniques for layer transfer and post transfer metallization to provide access to a backside of devices of an integrated radio frequency (RF) integrated structure. By contrast, access to devices, formed during a front-end-of-line (FEOL) process, is conventionally provided during a middle-of-line (MOL) processing that provides contacts between the gates and source/drain regions of the devices and back-end-of-line (BEOL) interconnect layers (e.g., M1, M2, etc.).

Figure 4:
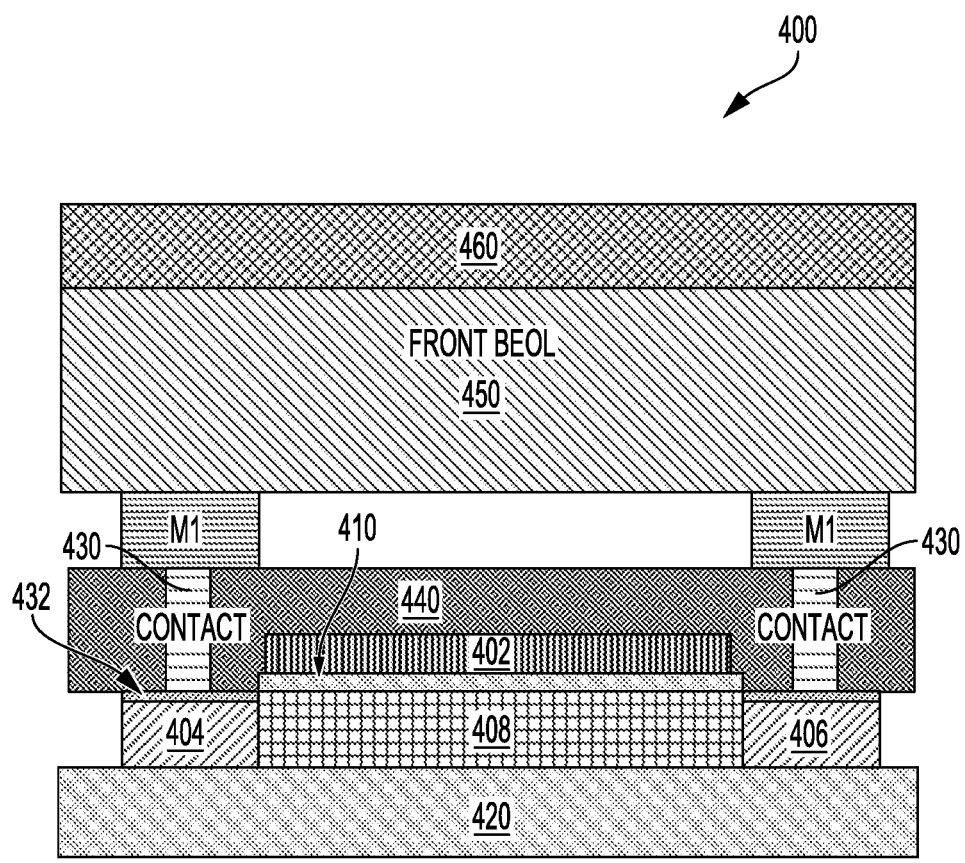
FIG. 4 illustrates a thick oxide depletion mode N-channel metal-oxide-semiconductor (NMOS) (TDN) transistor.

FIG. 4 shows a thick oxide depletion mode N-channel metal-oxide-semiconductor (NMOS) (TDN) transistor 400, which may be configured as a resistor. The TDN transistor 400 includes a gate 402, a source 404, a drain 406, and a channel 408. A gate oxide 410 is between the gate 402 and the channel 408. A buried oxide layer 420 supports the TDN transistor 400. Contacts 430 couple the source 404 and the drain 406 to a back end of line level 1 (M1) interconnect layer through an inter-metal dielectric layer 440. A silicide layer 432 couples the contacts 430 to the source 404 and the drain 406. The TDN transistor 400 is further coupled to a handle wafer 460 through back-end-of-line (BEOL) layers 450. BEOL materials, however, are not placed over the channel 408.

Disadvantages of the TDN transistor 400 include unanticipated field effects from the handle wafer 460, which is due to a proximity of the handle wafer 460 and a lack of sufficient shielding by the gate 402.

Figure 5:
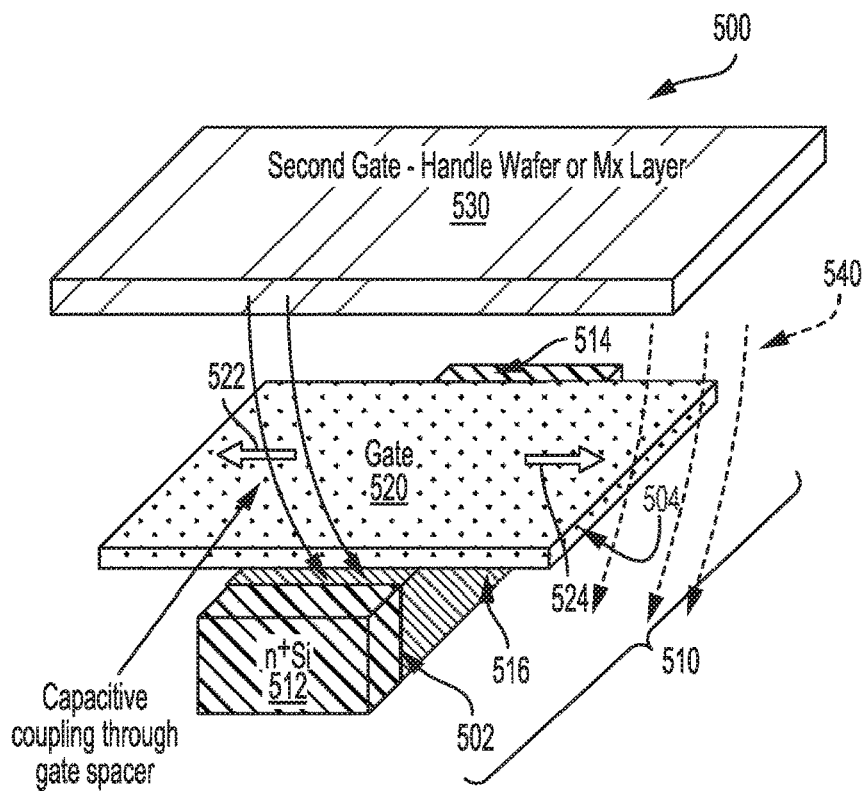
FIG. 5 illustrates a transistor having reduced second-gate effects, according to an aspect of the present disclosure.

FIG. 5 illustrates second-gate effects on a conventional metal-oxide-semiconductor field-effect transistor (MOSFET) 500 with substantial lateral extensions included to provide better shielding of channel edges. The MOSFET 500 includes a semiconductor layer 510 having a source 512, a drain 514, and a channel 516. In one configuration, the source 512 and the drain 514 are N+ doped and the channel 516 is of the same polarity and N− doped. For example, the channel 516 may be doped with a lower concentration than the source 512 and the drain 514. A gate 520 is above the semiconductor layer 510. A handle wafer 530 is over the gate 520. As described, the handle wafer 530 may act as a second gate that produces an undesirable second-gate effect. An upper level interconnect layer (e.g., Mx) may have similar issues. According to aspects of the present disclosure, the second-gate effect may be shielded by gate extensions 522 and 524 on both sides of the channel 516.

Although an orientation is depicted where one component is above or below another component, the present disclosure is not limited to a particular orientation. That is, the orientation may change such that the same component is for example, below, instead of above; or side by side, instead of above.

During a layer transfer process, linear and saturated source-drain current varies with a bias of the handle wafer 530. These variations are substantially larger in small-size and long-narrow channel devices relative to short-wide channel devices. Additionally, devices with a floating body and a symmetric gate exhibit almost twice as large of a variation compared to the variation in same-size devices with a larger gate extension 522 on one side of the channel 516 for accommodating body contacts. For example, thick-oxide devices show a larger variation than thin-oxide devices.

Devices with a weak or an intrinsic doping channel concentration are more sensitive to an electric field, and show larger relative variation, compared to devices with a more heavily doped channel. If a gate bias is reduced to being equal to or less than a threshold voltage, a drain current variation substantially increases compared to that in a saturation biased situation. As a result, the current varies on a portion of the gate 520 extending along the edge of the channel 516 and interconnect materials above the gate 520 depending on the distance between the handle wafer 530 and the semiconductor layer 510.

In some cases (not shown), the gate 520 does not completely shield the semiconductor layer body from electrical fields 540 generated from the handle wafer 530 (e.g., second gate or Mx layer). As a result, a conductive layer placed above the MOSFET 500 can still modulate channel conductance through the electric fields 540 that reach the semiconductor layer 510 along edges of the gate 520. This phenomenon may be referred to as a direct second-gate field effect.

Similar to a variable capacitance between the gate 520 and the semiconductor layer 510, the capacitance between the semiconductor layer 510 and the handle wafer 530 may be bias dependent. For example, a sidewall along a length of the channel 516 may have heavier doping than a low doped drain (LDD) region under the gate 520 along the channel width. When the handle wafer 530 is a semiconductor material, such as in a layer transfer SOI CMOS process, there is a possibility of area capacitance between the gate 520 and the handle wafer 530, which is modulated by the second-gate bias.

Second-gate capacitances are substantially smaller than those of the polysilicon gate and their variation can be a small fraction of a percent. Therefore, this effect is observable in large, specially designed transistor arrays and has significance in highly linear circuits when operating at high frequencies. Conductance changes indicate a possible variation of the free current carrier concentrations at the body sidewall along the channel length and, to a lesser degree, in the LDD regions along the channel width. These changes cause variation of the total capacitance between the semiconductor layer 510 and the handle wafer 530 in relation to a second gate bias. When the second-gate is a bias-sensitive Si handle wafer, it may form a MOS varactor with the polysilicon gate. This is referred to as a MOS-varactor second-gate effect.

As described, second-gate effects are undesirable because they interfere with proper functioning of the MOSFET 500. Therefore, there is a desire for small-sized, scalable transistors that overcome these deficiencies.

Aspects of the present disclosure provide for a transistor, including a semiconductor layer. The semiconductor layer may include a source region, a drain region, and a channel region between the source region and the drain region. The channel region may have an opposite polarity to a polarity of the source region and the drain region. A shielding layer is between the channel region and a handle wafer and extends beyond edges of the channel region.

FIG. 5 illustrates a transistor 500 having reduced second-gate effects, according to an aspect of the present disclosure. The transistor 500 may include a semiconductor layer 510 (e.g., a device body) having a source region 512, a drain region 514, and a channel region 516. The channel region 516 may have a source interface 502 and a drain interface 504. For example, the source interface 502 may be defined by a boundary between the source region 512 and the channel region 516. Similarly, the drain interface 504 may be defined by a boundary between the drain region 514 and the channel region 516. The channel region 516 may further be bounded by edges extending from the source interface 502 to the drain interface 504 on two boundaries between a field-sensitive semiconductor material and an isolation material (not shown).

According to an aspect of the present disclosure, the N-body under the channel 516 may be a field-sensitive material. For example, a conductance may be modulated by applying a vertical electrical field that may vary a concentration of free current carriers (e.g., electrons or holes) in the channel region 516, which move from the source 512 to the drain 514 due to an applied bias between them. Additionally, vertical plates defining the device body may extend an effective channel width to be larger on the top of the body where the channel is formed.

The isolation material may include a shallow trench isolation (STI) layer. According to an aspect of the present disclosure, the channel region 516 may extend perpendicular to the source region 512 and the drain region 514.

The transistor 500 may further include an insulator layer (e.g., gate oxide 410, see FIG. 4) between the channel region 516 and a gate 520. The gate 520 may be on the insulator layer. For example, the gate material may be polysilicon. An inter-metal dielectric (IMD) layer (e.g., IMD 440, see FIG. 4) may be deposited on the gate 520. A handle wafer 530 (e.g., a second gate) or an upper level (e.g., Mx) interconnect layer may be on the IMD layer.

According to an aspect of the present disclosure, the gate 520 has a first gate extension 522 and a second gate extension 524, which are beyond edges of the channel region 516. The first gate extension 522 and the second gate extension 524 may substantially exceed standard process design rules (e.g., a minimum specified value). For example, the extensions may be up to three times larger than typical for thin-oxide devices and even more (e.g., more than three times larger) for thick-oxide devices. According to aspects of the present disclosure, the extensions may substantially exceed the minimum specified value by at least 500 nanometers. The first gate extension 522 may extend laterally and away from the second gate extension 524. The first gate extension 522 and the second gate extension 524 may be configured to prevent the second-gate effect 540 from reaching the semiconductor layer 510. For example, the second-gate effect 540 may include electrostatic waves that disrupt operation of the transistor 500 if allowed to contact the semiconductor layer 510.

The gate extensions can coexist with floating body devices. The gate extensions can also coexist with devices having body contacts integrated into the source and along the non-contact body edge in body connected devices with T-gate body connections.

According to an aspect of the present disclosure, the source region 512 and the channel region 516 may be N+ doped. Additionally, the channel region 516 may have an opposite polarity to a polarity of the source region 512 and the drain region 514. For example, the channel may be N− doped or P− doped.

According to an aspect of the present disclosure, the transistor 500 may be a metal-oxide-semiconductor field-effect transistor (MOSFET). The transistor 500 may be a bulk and ultrathin silicon (Si) dual-gate MOSFET.

Figure 6:
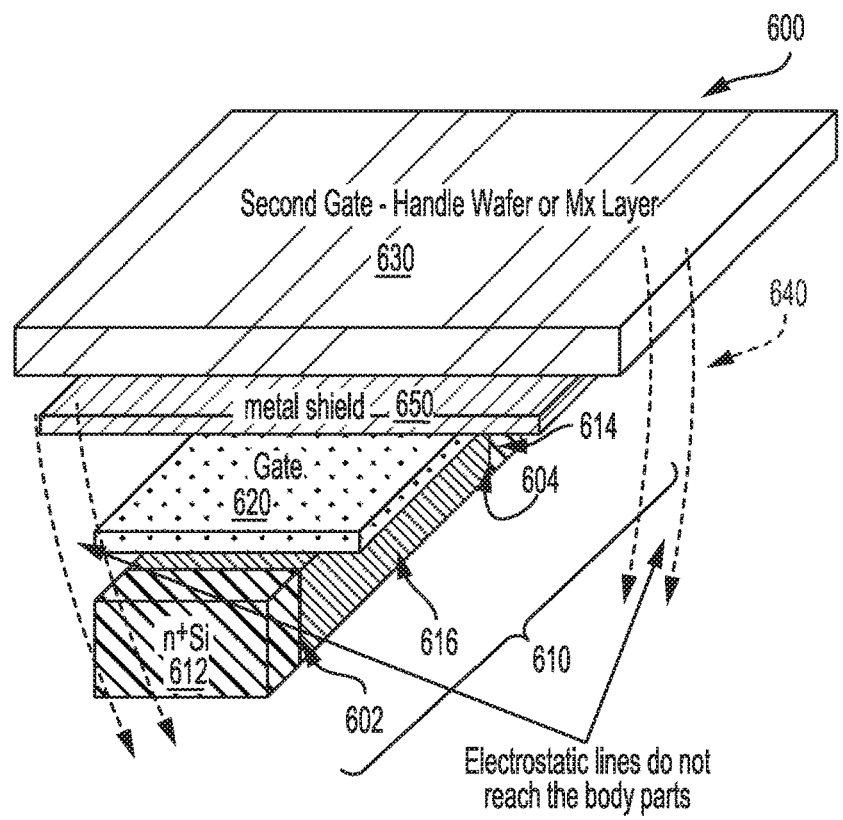
FIG. 6 illustrates another transistor having reduced second-gate effects, according to an aspect of the present disclosure.

FIG. 6 illustrates a transistor 600 having reduced second-gate effect, according to an aspect of the present disclosure. The transistor 600 may include a semiconductor layer 610 having a source region 612, a drain region 614, and a channel region 616. Similar to the above, the channel region 616 may be defined between a source interface 602 and a drain interface 604.

A gate 620 may be above the semiconductor layer 610. For example, the gate material may be polysilicon. A conductive shield 650 (e.g., a metal shield) may be above the gate 620. The conductive shield 650 may be in any upper interconnect layer (Mx). In one configuration, the conductive shield 650 is in the first interconnect level (M1). At least one inter-metal dielectric layer may be provided between the gate 620 and the conductive shield 650. For example, the conductive shield 650 may protect the semiconductor layer 610 from a second-gate effect 640 of a handle wafer 630. The conductive shield 650 may be wider or narrower than the handle wafer 630, and may be thicker or thinner than the handle wafer 630. The conductive shield 650 may be wider and/or longer than the gate 620. Depending on which interconnect level the conductive shield 650 is in, the conductive shield 650 may extend beyond edges of the channel region 616 by one micron or more. For example, the conductive shield 650 may be smaller at a lower level (e.g., M1 interconnect level) and larger at a higher level (e.g., M5 interconnect level).

According to an aspect of the present disclosure, the conductive shield 650 is sized to prevent the second-gate effect 640 from reaching and disrupting the semiconductor layer 610. For example, the conductive shield 650 may be longer and/or wider than both the gate 620 and the handle wafer 630. In this way, the conductive shield 650 blocks the semiconductor layer 610 from the second-gate effect 640.

According to an aspect of the present disclosure, the conductive shield 650 may be on an inter-metal dielectric (IMD) layer (See FIG. 4, IMD 440) between the gate 620 and the conductive shield 650. The conductive shield 650 may also cover transitions from the gate 620 to the source region 612 and from the gate 620 to the drain region 614 across the channel region 616. The conductive shield 650 may also be connected to one or more device terminals. For example, the conductive shield 650 may be connected to the source 612 to establish stable operating conditions regardless of a relative bias of all device terminals with respect to external circuit components above interconnects, including the handle wafer 630, in a layer transfer process.

Figure 7:
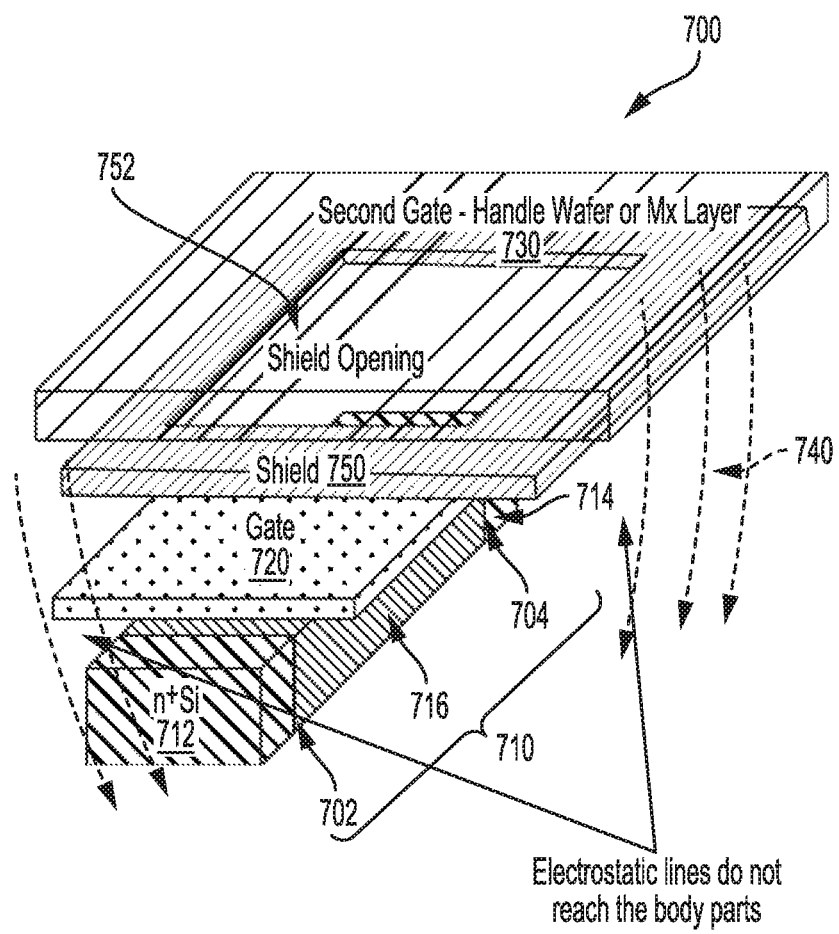
FIG. 7 illustrates another transistor having reduced second-gate effects, according to an aspect of the present disclosure.

FIG. 7 illustrates a transistor 700 having reduced second-gate effects, according to an aspect of the present disclosure. The transistor 700 may be substantially similar to the transistor 600 of FIG. 6. For example, the transistor 700 may include a semiconductor layer 710 having a source region 712, a drain region 714, and a channel region 716. The channel region 716 may be defined between a source interface 702 and a drain interface 704.

A gate 720 may be above the semiconductor layer 710. For example, the gate material may be polysilicon. A conductive shield 750 (e.g., a metal shield) may be above the gate 720. The conductive shield 750 may protect the semiconductor layer 710 from a second-gate effect of a handle wafer 730. The conductive shield 750 may be wider or narrower than the handle wafer 730, and may be thicker or thinner than the handle wafer 730. The conductive shield 750 may be wider and/or longer than the gate 720. Depending on which interconnect level the conductive shield 750 is in, the conductive shield 750 may extend beyond edges of the channel region 716 by one micron or more. For example, the conductive shield 750 may be smaller at a lower level (e.g., M1 interconnect level) and larger at a higher level (e.g., M5 interconnect level).

According to an aspect of the present disclosure, the conductive shield 750 may be formed from an interconnect layer and includes an opening 752. For example, the conductive shield 750 may be frame shaped, such that the opening 752 is directly under the handle wafer 730. In this way, the conductive shield 750 is able to block the second-gate effect 740 of the handle wafer 730 while also minimizing a parasitic capacitance of the conductive shield 750. Because body edges of the channel region 716 may be the most sensitive, the conductive shield 750 blocks the second-gate effect 740 while also minimizing the parasitic area capacitance.

The above-described second-gate effect may occur in a variety of fabrication techniques that include layer transfer. For example, second-gate effects may be detected in standard SOI CMOS processes from conductive layers placed above the transistor 700. The second-gate effect may be detected in relatively thin silicon (Si) layers. For increased Si thickness, the second-gate effect may be stronger due to a larger sidewall area of a transistor body along its channel edges.

Standard bulk CMOS processes, such as MOSFETs with body thicknesses in double and triple wells, are likely to experience stronger second-gate effects than devices where a transistor body extends into a wafer volume. Devices with an active area defined by shallow-trench isolation may also experience stronger second-gate effects when compared to legacy technologies. Because devices are not completely isolated from the substrate, the voltage swings on their terminals are limited, so strong second-gate effects that are possible in SOI processed devices are not expected.

Additionally, other semiconductor processes with multiple interconnect layers containing devices with field-sensitive parts that are exposed to external electrical fields may also exhibit second-gate effects. Second-gate effect reduction options may be process-specific, and field-sensitive parts may be protected by conductive layer shielding to ensure a constant electrical field during device operation in all expected biasing situations. This applies to FinFET technology as well.

Aspects of the present disclosure provide for a transistor having reduced second-gate effects. The transistor may include a semiconductor layer having a source region, a drain region, and a channel region between the source region and the drain region. A shielding layer may be above the channel region and may extend beyond edges of the channel region.

Figure 8:
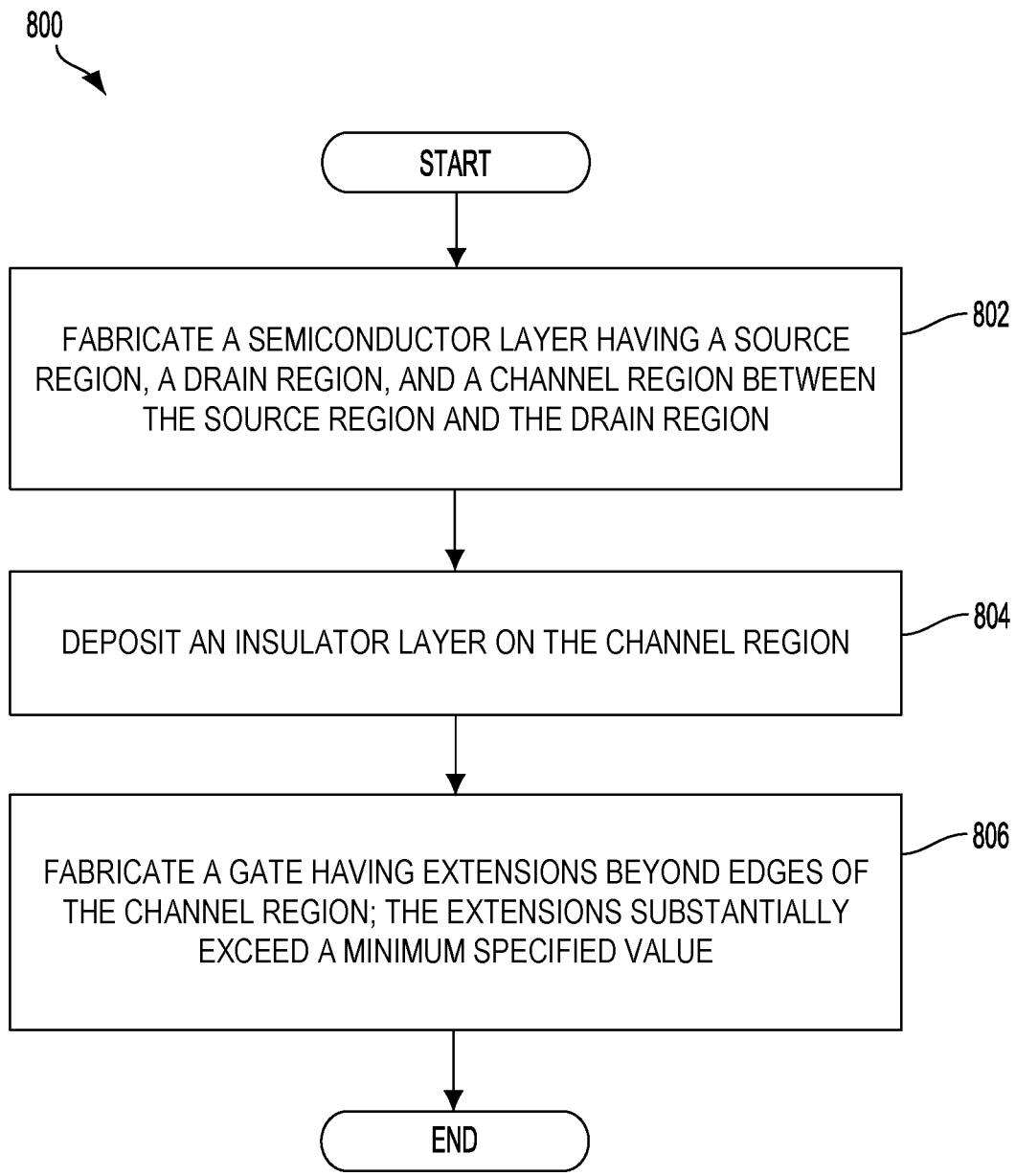
FIG. 8 illustrates a method of fabricating a transistor, according to aspects of the present disclosure.

FIG. 8 illustrates a method of fabricating a transistor, according to aspects of the present disclosure. A method 800 begins at block 802, in which a semiconductor layer is fabricated having a source region, a drain region, and a channel region between the source region and the drain region. For example, as shown in FIG. 5, the semiconductor layer 510 may include a source region 512, a drain region 514, and a channel region 516. The channel region may be created between the source region and the drain region.

At block 804, an insulator layer is deposited on the channel region. For example, as seen in FIGS. 4 and 5, the insulator layer 410 may be on the semiconductor layer 510. (404, 406, 408)

At block 806, a gate is fabricated with extensions beyond edges of the channel region. The extensions may substantially exceed a minimum specified value. For example, as shown in FIG. 5, the gate 520 may be fabricated with an extension beyond edges of the channel region 516. According to aspects of the present disclosure, the extensions may be up to three times larger than for typical for thin-oxide devices and even more (e.g., more than three times larger) for thick-oxide devices. For example, the extensions may substantially exceed the minimum specified value by at least 500 nanometers for a first gate, e.g., polysilicon extensions.

According to an aspect of the present disclosure, a transistor is described. In one configuration, the transistor includes means for shielding. For example, the shielding means may be the extended gate of FIG. 5 and/or the shields of FIGS. 6 and 7. In another aspect, the aforementioned means may be any module or any apparatus or material configured to perform the functions recited by the aforementioned means.

Figure 9:
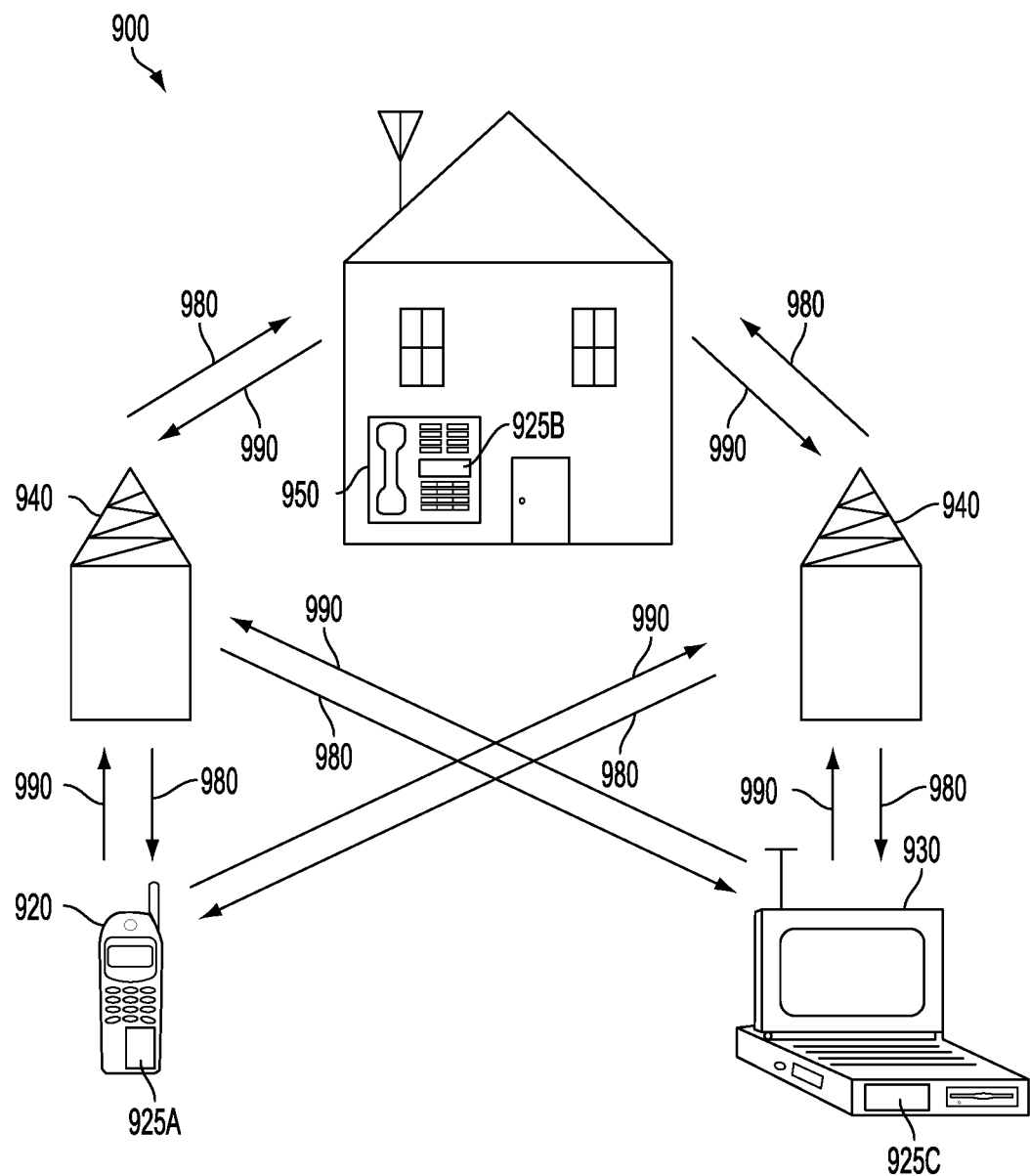
FIG. 9 is a block diagram showing an exemplary wireless communication system in which an aspect of the present disclosure may be advantageously employed.

FIG. 9 is a block diagram showing an exemplary wireless communication system 1000 in which an aspect of the present disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925B, and 925C that include the disclosed transistor. It will be recognized that other devices may also include the disclosed transistor, such as the base stations, switching devices, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 9 illustrates remote units according to the aspects of the present disclosure, the present disclosure is not limited to these exemplary illustrated units. Aspects of the present disclosure may be suitably employed in many devices, which include the disclosed transistor.

Figure 10:
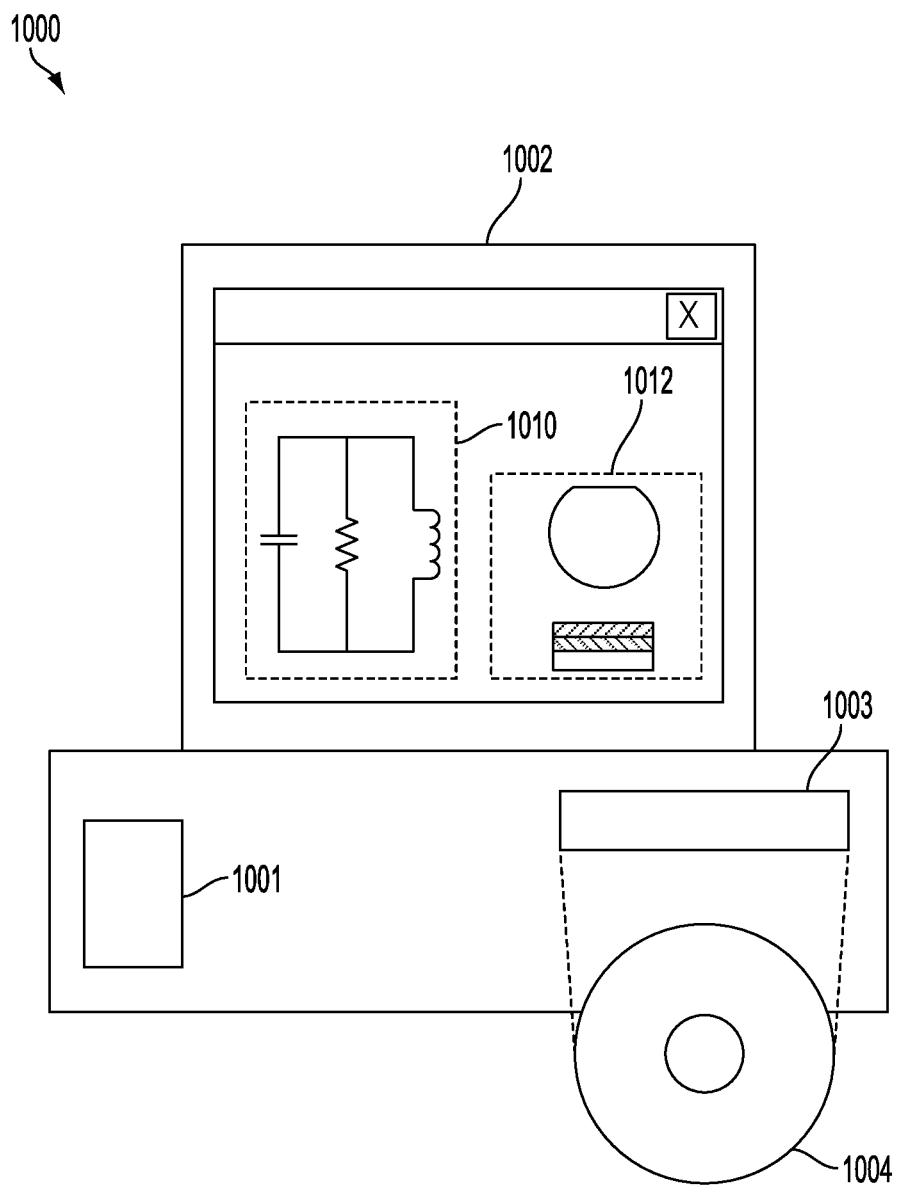
FIG. 10 is a block diagram illustrating a design workstation used for circuit, layout, and logic design of transistors according to one configuration.

FIG. 10 is a block diagram illustrating a design workstation used for circuit, layout, and logic design of an IC structure, such as the transistor disclosed above. A design workstation 1000 includes a hard disk 1001 containing operating system software, support files, and design software such as Cadence or OrCAD. The design workstation 1000 also includes a display 1002 to facilitate design of a circuit 1010 or an IC device 1012 including the disclosed transistor. A storage medium 1004 is provided for tangibly storing the design of the circuit 1010 or the IC device 1012. The design of the circuit 1010 or the IC device 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the IC device 1012 including the disclosed transistor by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on non-transitory computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the present disclosure is provided to enable any person skilled in the art to make or use the present disclosure. Various modifications to the present disclosure will be readily apparent to those skilled in the art, and the generic principles defined herein may be applied to other variations without departing from the spirit or scope of the present disclosure. Thus, the present disclosure is not intended to be limited to the examples and designs described herein but is to be accorded the widest scope consistent with the principles and novel features disclosed herein.

What is claimed is:

1. A transistor, comprising:
    a semiconductor layer comprising a source region, a drain region, and a channel region between the source region and the drain region, the channel region having a source interface, a drain interface, and bounded by edges of the channel region extending from the source interface to the drain interface, wherein the edges of the channel region are on two boundaries between a field-sensitive semiconductor material and an isolation material;
    an insulator layer on the channel region;
    a gate on the insulator layer, the gate disposed over the channel region and extending entirely between the source region and the drain region, the gate having extensions beyond the edges of the channel region, the extensions configured to protect the edges of the channel region from electrical fields generated from a handle wafer; and
    a conductive shield over the gate extended beyond the edges of the channel region.

2. The transistor of claim 1, further comprising:
    a first inter-metal dielectric (IMD) layer on the gate; and
    the conductive shield on the first inter-metal dielectric layer.

3. The transistor of claim 2, in which the conductive shield comprises an opening.

4. The transistor of claim 2, in which the conductive shield covers a transition from the gate to the source region across the channel region, and a transition from the gate to the drain region across the channel region.

5. The transistor of claim 1, in which the transistor is a metal-oxide-semiconductor field-effect transistor (MOSFET).

6. The transistor of claim 1, in which the channel region has an opposite polarity to a polarity of the source region and the drain region.

7. The transistor of claim 1, integrated into a mobile phone, a set top box, a music player, a video player, an entertainment unit, a navigation device, a computer, a handheld personal communication systems (PCS) unit, a portable data unit, and/or a fixed location data unit.

8. The transistor of claim 1, wherein the conductive shield is wider than the gate.

9. The transistor of claim 1, wherein the conductive shield is longer than the gate.

10. The transistor of claim 1, wherein the conductive shield is connected to the source region.

11. The transistor of claim 1, wherein the conductive shield is wider than the handle wafer.

12. The transistor of claim 1, wherein the channel region has a same polarity to a polarity of the source region and the drain region.

13. The transistor of claim 12, wherein the channel region has lighter doping than the source region and the drain region.

14. A transistor, comprising:
    a semiconductor layer having a source region, a drain region, and a channel region between the source region and the drain region, the channel region having a source interface, a drain interface, and bounded by edges of the channel region extending from the source interface to the drain interface, wherein the edges of the channel region are on two boundaries between a field-sensitive semiconductor material and an isolation material;
    an insulator layer on the channel region;
    a gate on the insulator layer, the gate disposed over the channel region and extending entirely between the source region and the drain region, the gate having extensions beyond the edges of the channel region, the extensions configured to protect the edges of the channel region from electrical fields generated from a handle wafer; and
    a shielding means over the gate to protect the edges of the channel region from the electrical fields generated from the handle wafer.

15. The transistor of claim 14, further comprising an opening within the shielding means.

16. The transistor of claim 14, integrated into a mobile phone, a set top box, a music player, a video player, an entertainment unit, a navigation device, a computer, a handheld personal communication systems (PCS) unit, a portable data unit, and/or a fixed location data unit.

* * * * *